United States Patent
Horibe

(10) Patent No.: US 10,460,971 B2
(45) Date of Patent: Oct. 29, 2019

(54) MULTI-CHIP PACKAGE ASSEMBLY

(71) Applicant: INTERNATIONAL BUSINESS MACHINES CORPORATION, Armonk, NY (US)

(72) Inventor: Akihiro Horibe, Kanagawa-ken (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1 day.

(21) Appl. No.: 15/695,398

(22) Filed: Sep. 5, 2017

(65) Prior Publication Data

US 2018/0096877 A1  Apr. 5, 2018

Related U.S. Application Data

(63) Continuation of application No. 15/281,464, filed on Sep. 30, 2016, now Pat. No. 9,887,119.

(51) Int. Cl.
*H01L 21/683* (2006.01)
*H01L 21/78* (2006.01)
(Continued)

(52) U.S. Cl.
CPC .......... *H01L 21/6835* (2013.01); *H01L 21/78* (2013.01); *H01L 24/92* (2013.01); *H01L 25/50* (2013.01); *H01L 27/1266* (2013.01); *H01L 2221/68322* (2013.01); *H01L 2221/68368* (2013.01); *H01L 2221/68381* (2013.01)

(58) Field of Classification Search
CPC .................. H01L 24/92; H01L 25/0655; H01L 21/6835–6836; H01L 21/78; H01L 21/782–786; H01L 21/268–2686; H01L 2221/68322; H01L 2221/68363; H01L 2221/68368; H01L 2221/68381;
(Continued)

(56) References Cited

U.S. PATENT DOCUMENTS

| | | | | |
|---|---|---|---|---|
| 6,204,079 B1 * | 3/2001 | Aspar | .................. | H01L 21/568 257/E21.505 |
| 6,559,905 B1 * | 5/2003 | Akiyama | ................ | H01L 24/24 349/45 |

(Continued)

OTHER PUBLICATIONS

List of IBM Patents or Patent Applications Treated as Related dated Sep. 5, 2017, 2 pages.

(Continued)

*Primary Examiner* — Zandra V Smith
*Assistant Examiner* — Jeremy J Joy
(74) *Attorney, Agent, or Firm* — Tutunjian & Bitetto, P.C.; Vazken Alexanian

(57) ABSTRACT

Methods of bonding chips to a substrate and transfer wafers used for such bonding include bonding chips to a first support wafer by a first adhesive layer. The chips are bonded to a second support wafer by a second adhesive layer. Regions of the first adhesive layer are selectively weakened to decrease an adhesive strength in weakened regions. The weakened regions correspond to a subset of chips. The second support wafer is separated from the first wafer, such that the subset of chips in the weakened regions debond from the first support wafer. The subset of chips are bonded to a target substrate.

19 Claims, 7 Drawing Sheets

(51) Int. Cl.
  *H01L 23/00* (2006.01)
  *H01L 25/00* (2006.01)
  *H01L 27/12* (2006.01)

(58) Field of Classification Search
  CPC . H01L 27/1266; H01L 25/50; H01L 25/0753; H01L 24/95–97; H01L 21/26
  See application file for complete search history.

(56) References Cited

U.S. PATENT DOCUMENTS

| | | | | |
|---|---|---|---|---|
| 6,959,863 | B2* | 11/2005 | Figuet | H01L 21/6835 235/449 |
| 8,257,538 | B2* | 9/2012 | Doi | H01L 21/6835 156/241 |
| 8,804,356 | B2 | 8/2014 | Dotsenko | |
| 2002/0064032 | A1* | 5/2002 | Oohata | H04N 9/30 361/760 |
| 2003/0010970 | A1* | 1/2003 | Hara | H01L 27/1214 257/9 |
| 2003/0011738 | A1* | 1/2003 | Akiyama | H01L 21/6835 349/156 |
| 2004/0067023 | A1* | 4/2004 | Hanashinna | G02B 6/12007 385/43 |
| 2004/0201789 | A1* | 10/2004 | Akiyama | H01L 24/24 349/43 |
| 2004/0235267 | A1* | 11/2004 | Sheats | H01L 21/67092 438/455 |
| 2010/0258543 | A1* | 10/2010 | Mizuno | H01L 21/268 219/121.72 |
| 2012/0119201 | A1* | 5/2012 | Ueno | H01L 51/5048 257/40 |
| 2012/0217657 | A1 | 8/2012 | Huang et al. | |
| 2012/0273831 | A1* | 11/2012 | Suga | H01L 27/1266 257/99 |
| 2014/0061895 | A1 | 3/2014 | Foong et al. | |
| 2014/0073087 | A1 | 3/2014 | Huang et al. | |
| 2015/0303176 | A1 | 10/2015 | Seng | |
| 2018/0069149 | A1* | 3/2018 | Zou | H01L 21/68 |

OTHER PUBLICATIONS

AI Technology, Inc. | Dicing Die Attach Film Adhesives, http://www.aitechnology.com/products/dieattach/dafilm/, Feb. 2016.

* cited by examiner

US 10,460,971 B2

MULTI-CHIP PACKAGE ASSEMBLY

BACKGROUND

Technical Field

The present invention generally relates to assembling multi-chip packages and, more particularly, to bonding multiple chips at once.

Description of the Related Art

Modern device manufacturing processes make use of multiple individual chips on a single board or package. Often these multi-chip packages are assembled by bonding a single chip at a time to a substrate. While one-at-a-time bonding is cost-effective when the cost of individual chips is large relative to the cost of bonding the chips to the substrate, miniaturization has resulted in very small and very inexpensive chips that can be placed densely on a board. As the cost of the individual chips decreases, the cost of assembly increases as a proportion of the total manufacturing cost.

SUMMARY

A method of bonding chips to a substrate includes bonding chips to a first support wafer by a first adhesive layer. The chips are bonded to a second support wafer by a second adhesive layer. Regions of the first adhesive layer are selectively weakened to decrease an adhesive strength in weakened regions. The weakened regions correspond to a subset of chips. The second support wafer is separated from the first wafer, such that the subset of chips in the weakened regions debond from the first support wafer. The subset of chips are bonded to a target substrate.

A method of bonding chips to a substrate includes bonding a plurality of chips to a first support wafer by a first adhesive layer. The plurality of chips are bonded to an intermediate support wafer by a second adhesive layer. Regions of the first adhesive layer are selectively weakened to decrease an adhesive strength in weakened regions. The weakened regions of the first adhesive layer correspond to a subset of the plurality of chips. Regions of the second adhesive layer are selectively weakened to decrease an adhesive strength in weakened regions. The regions of the second adhesive layer are complementary to the regions of the first adhesive layer. The intermediate support wafer is separated from the first wafer, such that the subset of the plurality of chips in the weakened regions of the first adhesive layer debond from the first support wafer, leaving a remainder of the plurality of chips bonded to the first support wafer. The remainder of the plurality of chips is bonded to a final support wafer by a third adhesive layer. Remaining regions of the first adhesive layer are weakened to decrease an adhesive strength in regions corresponding to the remainder of the plurality of chips. The final support wafer is separated from the first support wafer, such that the remainder of the plurality of chips debond from the first support wafer. The remainder of the plurality of chips is bonded to a target substrate.

A transfer wafer includes a glass wafer substrate. An adhesive layer is formed directly on the glass wafer substrate. A plurality of chips are bonded to the glass wafer substrate by the ultraviolet-sensitive adhesive layer. A subset of the plurality of chips are bonded less strongly than a remainder of the plurality of the chips.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide low-cost assembly of multi-chip packages. In particular, multiple chips are formed on an initial wafer and then diced to separate them. Multiple chips are removed from the initial wafer using a transfer wafer by selectively weakening the adhesive on the initial wafer. The chips are then bonded to a carrier package and removed from the transfer wafer. In this way multiple chips can be bonded to the carrier package at once via the transfer wafer, substantially reducing the amount of time and effort needed to bond each chip to the package.

Figure 1:
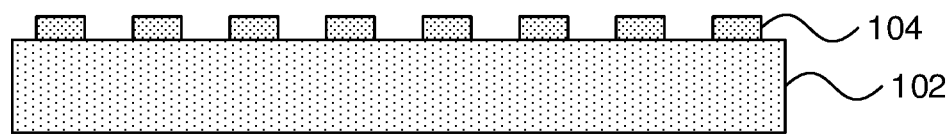
FIG. 1 is a cross-sectional diagram of a step in the transfer of multiple chips to a target package in accordance with embodiments of the present invention.

Referring now to FIG. 1, a cross-sectional view of a step in bonding chips to a multi-chip package substrate is shown. A series of chips 104 are formed on a wafer 102. The wafer 102 may be a semiconductor substrate. The wafer may be formed from a silicon-containing material such as, e.g., silicon, silicon germanium, silicon germanium carbide, silicon carbide, polysilicon, epitaxial silicon, amorphous silicon, and multilayers thereof. Although silicon is the predominately used semiconductor material in wafer fabrication, alternative semiconductor materials can be employed such as, but not limited to, germanium, gallium arsenide, gallium nitride, cadmium telluride, and zinc selenide.

The chips 104 may be formed from any appropriate process and, in some embodiments, may be embedded in the surface of the wafer 102. The chips 104 include one or more devices and any appropriate contacts to form interconnects to other chips and off-chip devices.

Figure 2:
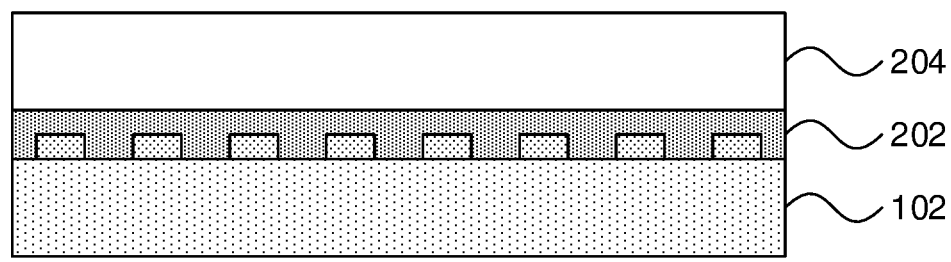
FIG. 2 is a cross-sectional diagram of a step in the transfer of multiple chips to a target package in accordance with embodiments of the present invention.

Referring now to FIG. 2, a cross-sectional view of a step in bonding chips to a multi-chip package substrate is shown. An adhesive layer 202 is formed over the chips 104 and the substrate 102. The adhesive layer 202 is formed from an adhesive material that is sensitive to ultraviolet light. In particular, the adhesion strength of the adhesive material decreases when the adhesive material is exposed to ultraviolet light. The adhesive layer 202 is used to bond a first support glass wafer 204 to the substrate 102 and the chips 104. The first support glass wafer 204 is selected to be transparent to, or at least significantly transmissive of, ultraviolet light. The first support glass wafer 204 is also selected to have a coefficient of thermal expansion close to that of silicon (e.g., about 0 ppm to about 6 ppm) to minimize misalignment of bonded chips.

Figure 3:
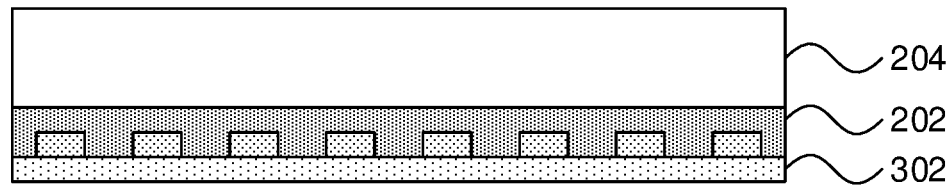
FIG. 3 is a cross-sectional diagram of a step in the transfer of multiple chips to a target package in accordance with embodiments of the present invention.

Referring now to FIG. 3, a cross-sectional view of a step in bonding chips to a multi-chip package substrate is shown. The wafer 102 is thinned significantly producing thinned wafer 302. Thinning may be performed by any appropriate mechanism. In one specific embodiment, chemical mechanical planarization (CMP) may be used to reduce the thickness of the wafer 102. CMP is performed using, e.g., a chemical or granular slurry and mechanical force to gradually remove upper layers of the device. Alternatively, any appropriate isotropic or anisotropic, wet or dry chemical etch may be used to remove material from the wafer 102. The etch may be timed to ensure that the thinned wafer 302 is not removed entirely.

Figure 4:
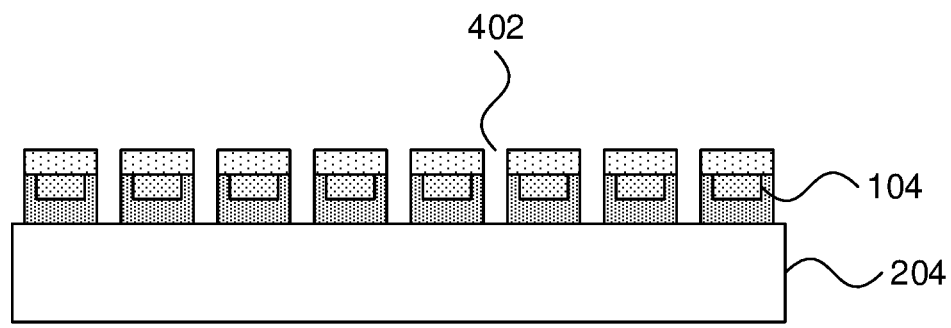
FIG. 4 is a cross-sectional diagram of a step in the transfer of multiple chips to a target package in accordance with embodiments of the present invention.

Referring now to FIG. 4, a cross-sectional view of a step in bonding chips to a multi-chip package substrate is shown—the vertical orientation has been flipped in this perspective. The chips 104 are diced from one another to separate the chips on the first support glass wafer 204. Dicing may be performed by any appropriate process, although it is specifically contemplated that a dry etch process such as, e.g., reactive ion etch (RIE) may be used instead of blade dicing to minimize the kerf width between neighboring chips. In one embodiment, the kerf width of the RIE is less than about 20 nm. The etch leaves a gap 402 between the neighboring chips 104, which remain bonded to the first support glass wafer 204 by the adhesive material. In alternative embodiments, the dicing process does not remove the adhesive material between chips 104.

RIE is a form of plasma etching in which, during etching, the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 5:
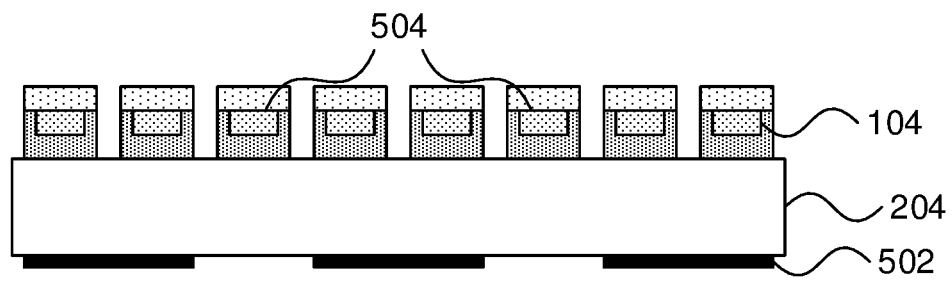
FIG. 5 is a cross-sectional diagram of a step in the transfer of multiple chips to a target package in accordance with embodiments of the present invention.

Referring now to FIG. 5, a cross-sectional view of a step in bonding chips to a multi-chip package substrate is shown. A photo mask 502 is patterned on the first support glass wafer 204, leaving exposed particular chips 504 that will be transferred. The chips 504 are released in a pattern that corresponds with a positioning pattern on the target multi-chip packages. For example, if the target wafer will have multiple packages, there may be one chip 504 for each of the packages, with the spacing between exposed chips 504 corresponding to the size of the target packages such that the positioning of the exposed chips 504 corresponds directly to the intended positioning of the chips on the target packages.

Figure 6:
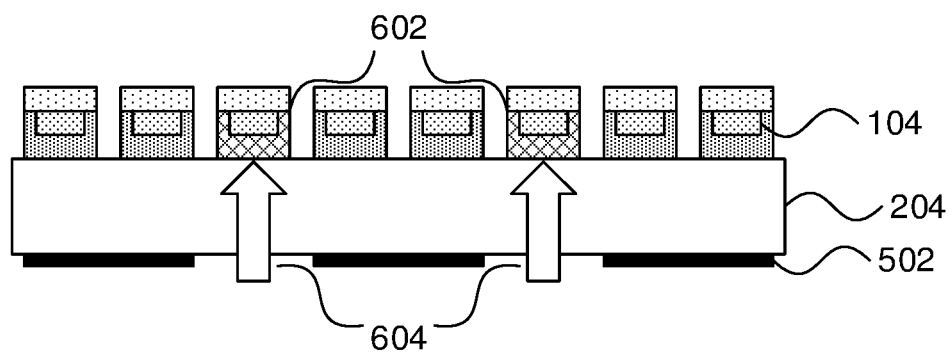
FIG. 6 is a cross-sectional diagram of a step in the transfer of multiple chips to a target package in accordance with embodiments of the present invention.

Referring now to FIG. 6, a cross-sectional view of a step in bonding chips to a multi-chip package substrate is shown. Ultraviolet light 604 is provided through the first support glass wafer 204 to weaken the adhesive material 602 bonding the exposed chips 504. It should be understood that any appropriate wavelength of light may be used if the adhesive material is sensitive to that wavelength, and that ultraviolet is used herein solely for the purpose of discussion.

Figure 7:
FIG. 7 is a cross-sectional diagram of a step in the transfer of multiple chips to a target package in accordance with embodiments of the present invention.

Referring now to FIG. 7, a cross-sectional view of a step in bonding chips to a multi-chip package substrate is shown. A second support glass wafer 702 is introduced with a second layer 704 of adhesive material. In this embodiment, the second adhesive layer 704 is a heat resist adhesive that has a high heat resistance for thermal compression bonding at or about, e.g., 250° C. Notably the second adhesive layer 704 may not be sensitive to ultraviolet light. Any appropriate heat resist adhesive may be used as long as it has an adhesive strength that is weaker than the unexposed adhesive material used in the first adhesive layer 202. Thus, the relationship between the adhesive strengths is $S_1 < S_2 < S_3$, with $S_1$ being the adhesive strength of the weakened ultraviolet-sensitive material, with $S_2$ being the adhesive strength of the heat resist adhesive material, and with $S_3$ being the adhesive strength of the unexposed ultraviolet-sensitive material.

Figure 8:
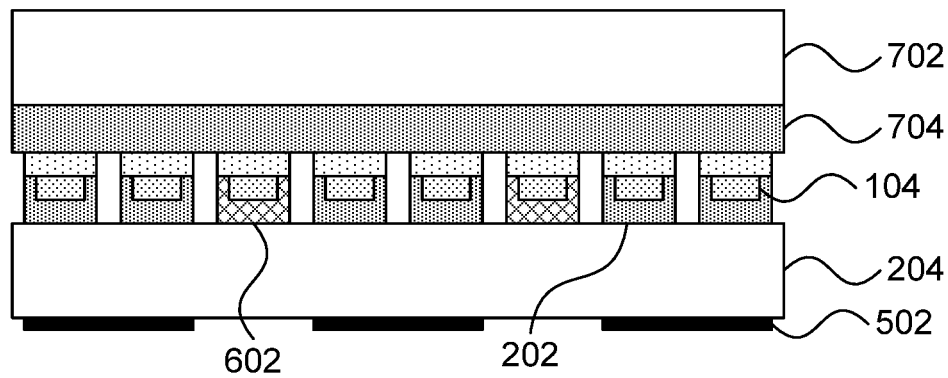
FIG. 8 is a cross-sectional diagram of a step in the transfer of multiple chips to a target package in accordance with embodiments of the present invention.

Referring now to FIG. 8, a cross-sectional view of a step in bonding chips to a multi-chip package substrate is shown. The adhesive layer 704 on the second support glass wafer 702 is brought into contact with the remaining wafer material 302 of chips 104. The adhesive material in the second adhesive layer 704 on the second support glass wafer and the unexposed portions of the first adhesive layer 202 on the first support glass wafer retain their full adhesive strength. In contrast, the exposed portions of adhesive material 602 is substantially weakened, such that the adhesive strength of the exposed portion 602 is less than the adhesive strength of second adhesive layer 704. It should be noted that the application of ultraviolet light 604 may alternatively be performed after the bonding of the first support glass layer 204 and the second glass support layer 702, as the second adhesive material is not sensitive to ultraviolet light.

Figure 9:
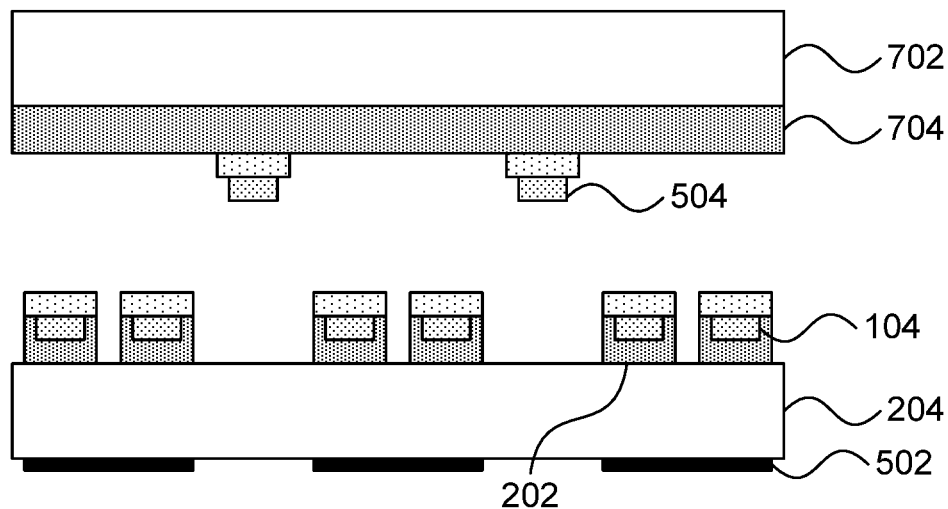
FIG. 9 is a cross-sectional diagram of a step in the transfer of multiple chips to a target package in accordance with embodiments of the present invention.

Referring now to FIG. 9, a cross-sectional view of a step in bonding chips to a multi-chip package substrate is shown. The first support glass wafer 204 is pulled away from the second support glass wafer 702. The exposed adhesive regions 602 break and chips 504 are pulled away with the second support glass wafer 702. Those chips 504 that are in unexposed regions remain bound to the first support glass wafer 204. The second support glass wafer 702 can then be maneuvered as needed. Although the weakened ultraviolet-sensitive adhesive material that bonded the chips 504 is shown as having been removed, this material may remain on the first support glass wafer 204. Any weakened ultraviolet-sensitive material can be washed from the first support glass wafer 204 and chips 504 before further processing.

In this step, the force that is exerted to debond the first support glass wafer 204 from the second support glass wafer 702 can be significant. The force needed to separate the wafers 204 and 702 is the sum of the force needed to debond each individual chip 504—the force needed to overcome the weaker adhesive bonded to the chip. As such, the total debonding force for a first adhesive x (the weakened ultraviolet-sensitive adhesive layer 602) and a second adhesive y (the heat resist adhesive layer 704) will be:

$$F = S_x A_x + S_y A_y$$

where $S_x$ and $S_y$ are the forces per unit area needed to break the respective adhesive and $A_x$ and $A_y$ are the areas for chips where the respective adhesive is the weakest adhesive bonded to the chip. It should be noted that the strongest adhesive present (unexposed ultraviolet-sensitive adhesive) is not considered because the weaker bonds will break before the strongest bonds do. The large force needed to separate the support glass wafers 204 and 702 can in some cases pose a risk of damaging the wafers and/or chips 504. To reduce the risk and to make the fabrication process easier, an intermediate transfer step may be used, as described in more detail below.

Figure 10:
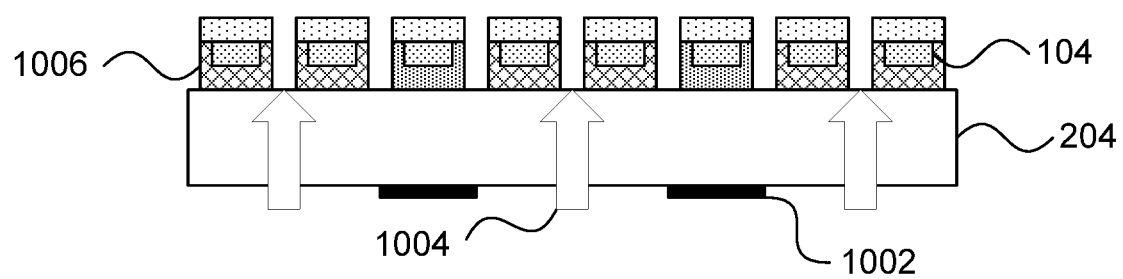
FIG. 10 is a cross-sectional diagram of a step in the transfer of multiple chips to a target package in accordance with embodiments of the present invention.

Referring now to FIG. 10, a cross-sectional view of an alternative step in bonding chips to a multi-chip package substrate is shown. This step begins with the first support glass wafer 204 after dicing as shown in FIG. 4. Instead of leaving unmasked the regions where the chips to be transferred to the final package will be removed, the masks 1002 in this embodiment are applied to regions where the chips to be transferred will instead be retained. In this embodiment, the first support glass wafer subsequently transfers these chips to an intermediate glass support wafer, which then transfers the chips to the final package. As such, ultraviolet light 1004 is applied to the adhesive layer 104 to weaken regions 1006.

Figure 11:
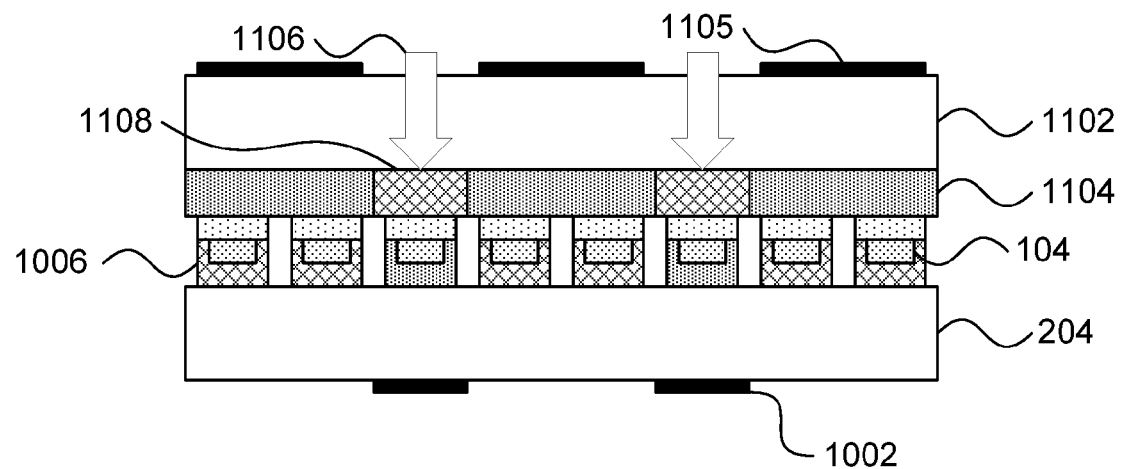
FIG. 11 is a cross-sectional diagram of a step in the transfer of multiple chips to a target package in accordance with embodiments of the present invention.

Referring now to FIG. 11, a cross-sectional view of an alternative step in bonding chips to a multi-chip package substrate is shown. An intermediate support glass wafer 1102 is introduced with an intermediate adhesive layer 1104 that is formed with an ultraviolet-sensitive adhesive material. Regions of the intermediate support glass wafer 1102 are masked with masks 1105 and ultraviolet light 1106 is applied through the intermediate support glass wafer 1102 to weaken the adhesive strength of the exposed regions 1108 of the intermediate adhesive layer 1104. The masks 1105 are formed on regions of the intermediate support glass wafer 1102 that complement the masks 1002 on the first support glass wafer 204.

The intermediate wafer 1102 is bonded to the first support glass wafer 204. Each chip 104 is bonded on one side to a wafer by weakened ultraviolet-sensitive adhesive material and on the other side by full-strength ultraviolet-sensitive material. As a result, the debonding force to separate the intermediate support glass wafer 1102 from the first support glass wafer 204 is reduced to $S_x A$, with A representing the total area of all the chips 104. This is lower than the force needed in the embodiment of FIGS. 8 and 9 because each chip 104 is separated by the force needed to overcome the weakened ultraviolet-sensitive material and none are bonded by the stronger heat resist adhesive material.

Figure 12:
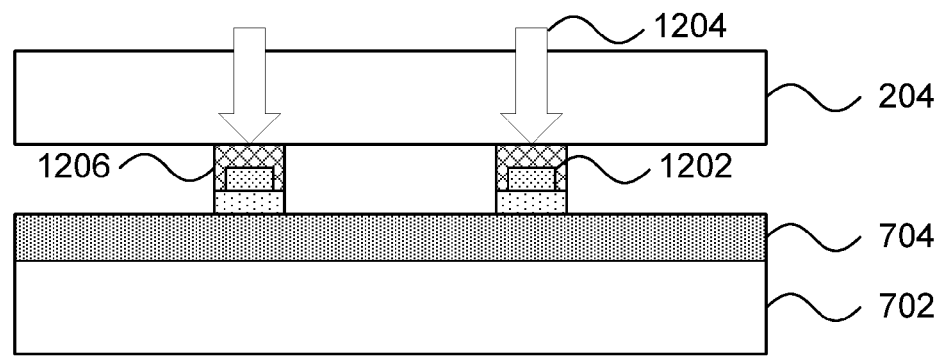
FIG. 12 is a cross-sectional diagram of a step in the transfer of multiple chips to a target package in accordance with embodiments of the present invention.

Referring now to FIG. 12, a cross-sectional view of an alternative step in bonding chips to a multi-chip package substrate is shown. The first support glass wafer 204 is bonded to second support glass wafer 702 with the heat resist adhesive material 704. The masks 1002 are removed and ultraviolet light 1204 is provided through the first support glass wafer 204 to expose all remaining portions of the ultraviolet-sensitive adhesive layer, resulting in weakened ultraviolet-sensitive material layer 1206. When the first support glass wafer 204 is separated from the second support glass wafer 702, the amount of force needed to debond the wafers is only $S_x A_y$. The total force is much lower because the number of chips 1202 transferred on the first support glass wafer 204 in this embodiment (and hence the adhesion area) is significantly reduced and the only adhesive to overcome is the weakened ultraviolet-sensitive adhesive material, with the area affected being significantly smaller than the total area of the wafer.

Figure 13:
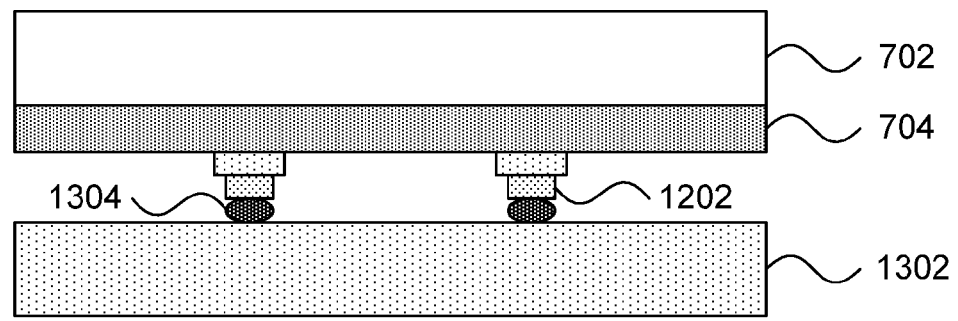
FIG. 13 is a cross-sectional diagram of a step in the transfer of multiple chips to a target package in accordance with embodiments of the present invention.

Referring now to FIG. 13, a cross-sectional view of a step in bonding chips to a multi-chip package substrate is shown. Regardless of whether an intermediate support glass wafer 1102 is used, at this stage the second support glass wafer 702 is bonded to a semiconductor carrier wafer 1302. The carrier wafer 1302 may be any appropriate semiconductor material as described above and has a set of contact pads 1304 that correspond to positions where chips 1202 may be attached. The contact pads 1304 may include, e.g., conductive contacts, solder balls, or any other appropriate structure for attaching a chip to a wafer. After the chips 1202 are securely attached to the contact pads 1304, the second support glass wafer 702 may be detached by, e.g., applying heat to weaken the heat resist adhesive layer 704 or by mechanical force if the strength of the attachment to contact pads 1304 is sufficient. In this manner, multiple chips can be attached to the carrier wafer 1302 at once. The process can be repeated any number of times to position different chips on the carrier wafer 1302. The carrier wafer 1302 can the diced to separate out complete multi-chip packages.

Figure 16:
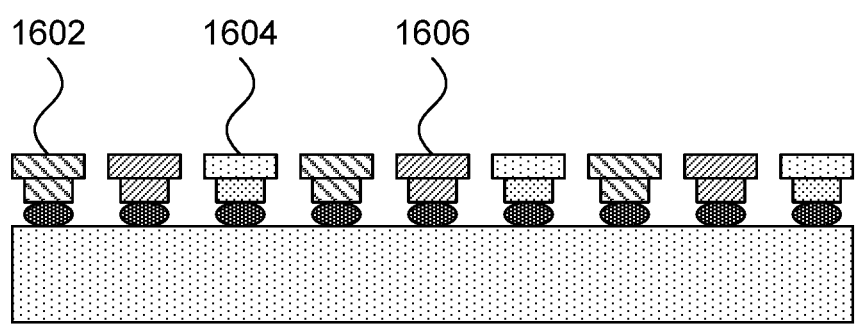
FIG. 16 is a cross-sectional diagram of a step in the transfer of multiple chips to a target package in accordance with embodiments of the present invention.

Referring now to FIG. 16, a cross-sectional view of a step in bonding chips to a multi-chip package substrate is shown. After bonding a first set of chips 1602, additional types of chips may be bonded as well (shown as, e.g., second set of chips 1604 and third set of chips 1606). In one specific embodiment, the first set of chips 1602 may be processor chips, the second set of chips 1604 may be memory chips, and the third set of chips 1606 may be battery chips. Any number of chips can be bonded in this manner, and the chips may have any appropriate function, with the pattern and positioning being dependent on the design of the individual chip packages, of which there may be many on a single wafer.

Figure 17:
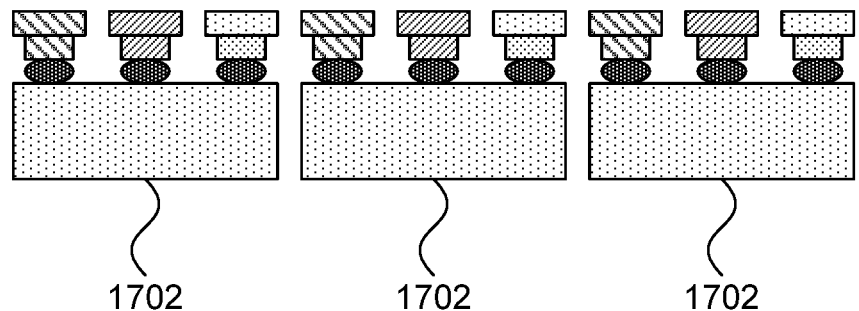
FIG. 17 is a cross-sectional diagram of a step in the transfer of multiple chips to a target package in accordance with embodiments of the present invention.

Referring now to FIG. 17, a cross-sectional view of a step in bonding chips to a multi-chip package substrate is shown. The chip packages 1702 are diced, separating them from one another. Each chip package 1702 may have identical sets of chips 1602/1604/1606 or may, alternatively, have different chip patterns in accordance with a design layout.

It is to be understood that aspects of the present invention will be described in terms of a given illustrative architecture; however, other architectures, structures, substrate materials and process features and steps may be varied within the scope of aspects of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 14:
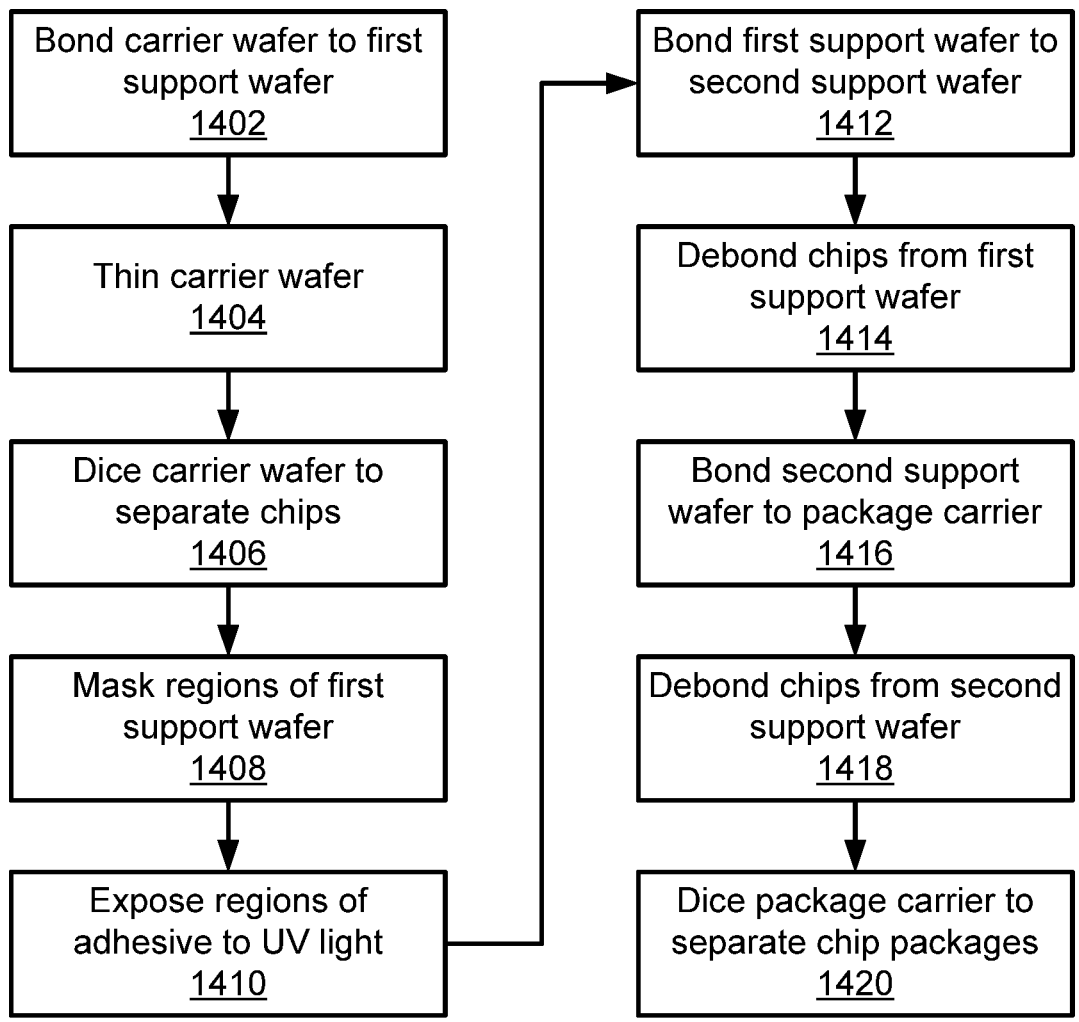
FIG. 14 is a block/flow diagram of a method of transferring multiple chips to a target package in accordance with embodiments of the present invention.

Referring now to FIG. 14, a method of bonding chips to a multi-chip package substrate is shown. Block 1402 bonds the carrier wafer 102, which has chips 104 thereon, to the first support glass wafer 204. Block 1404 thins the carrier wafer 102 using any appropriate mechanism such as, e.g., CMP or an etch process. Block 1406 dices the thinned carrier wafer 302 to separate the chips 104 from one another using, e.g., RIE or some other anisotropic etch process having a small kerf width.

Block 1408 masks regions of the first support wafer using masks 502, leaving chips 504 exposed. Block 1410 then exposes the unmasked regions 602 of the ultraviolet-sensitive adhesive layer 202 to weaken the adhesive strength in those regions. Block 1412 bonds the first support wafer 204 to a second support wafer 702 using a heat resist adhesive layer 704. Block 1414 pulls the two wafers apart, debonding the exposed chips 504 from the first support glass wafer 204. Block 1416 bonds the second support wafer 702 to the package carrier substrate 1302 using the contact points 1304 to attach the chips 504 to the substrate 1302. Block 1418 then debonds the chips 504 from the second support wafer 702 using, e.g., heat to weaken the heat resist adhesive layer 704. This leave the chips 504 remaining on the surface of the substrate 1302. This transfer of chips to the substrate 1302 may be repeated for any number of chips to form multi-chip packages on the substrate 1302. Block 1420 then dices the substrate to separate out the chip packages.

Figure 15:
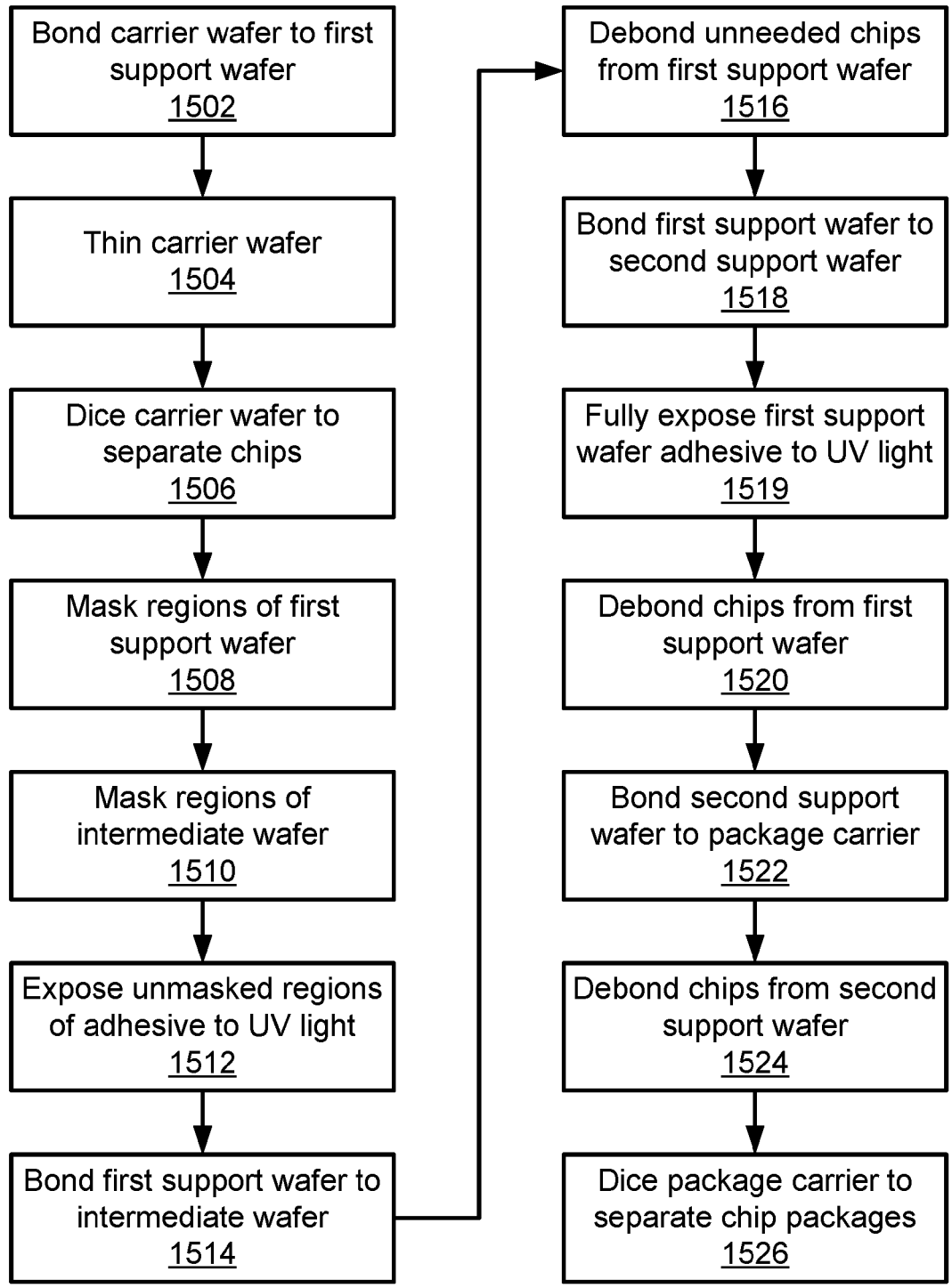
FIG. 15 is a block/flow diagram of a method of transferring multiple chips to a target package in accordance with embodiments of the present invention.

Referring now to FIG. 15, an alternative method of bonding chips to a multi-chip package substrate is shown. As above, block 1502 bonds the carrier wafer 102, which has chips 104 thereon, to the first support glass wafer 204. Block 1504 thins the carrier wafer 102 using any appropriate mechanism such as, e.g., CMP or an etch process. Block 1506 dices the thinned carrier wafer 302 to separate the chips 104 from one another using, e.g., RIE or some other anisotropic etch process having a small kerf width.

Block 1508 masks regions of the first support wafer using masks 1002, leaving regions of adhesive 1006 exposed and block 1510 masks complementary regions of an intermediate wafer 1102. Block 1512 exposes the unmasked regions 1006 and 1108 of the first ultraviolet-sensitive adhesive layer 202 and the second ultraviolet-sensitive adhesive layer 1104 respectively to ultraviolet light to weaken the adhesive strength in those regions. This exposure can be performed in one step or in separate steps in any order. Block 1514 bonds the first support wafer 204 to the intermediate wafer 1102. It should be noted that this bonding in block 1514 may alternatively be performed prior to exposure of the unmasked regions. Block 1516 pulls the two wafers apart, debonding chips other than retained chips 1202 from the first support glass wafer 204.

Block 1518 bonds the first support glass wafer 204 to a second support glass wafer 702 using heat resist adhesive layer 704. Block 1519 fully exposes the remaining regions of adhesive 1206 on the first support glass wafer 204 to ultraviolet light to weaken all regions of that adhesive layer. Block 1520 then debonds the chips from the first support glass wafer 204 by pulling the first support glass wafer 204 away from the second support glass wafer 702.

Block 1522 bonds the second support wafer 702 to the package carrier substrate 1302 using the contact points 1304 to attach the chips 1202 to the substrate 1302. Block 1524 then debonds the chips 1202 from the second support wafer 702 using, e.g., heat to weaken the heat resist adhesive layer 704. This leave the chips 1202 remaining on the surface of the substrate 1302. This transfer of chips to the substrate 1302 may be repeated for any number of chips to form multi-chip packages on the substrate 1302. Block 1526 then dices the substrate to separate out the chip packages.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of bonding chips to a substrate, comprising:
   applying a first adhesive layer to a chip wafer, such that the first adhesive layer is formed over and around a plurality of chips;
   bonding the chip wafer to a first support wafer by the first adhesive layer;
   dicing the chip wafer to separate the plurality of chips on the first support wafer;
   bonding the plurality of chips to a second support wafer by a second adhesive layer;
   selectively weakening regions of the first adhesive layer to decrease an adhesive strength in weakened regions, said regions corresponding to a subset of the plurality of chips;
   separating the second support wafer from the first wafer, such that the subset of the plurality of chips in the weakened regions debond from the first support wafer; and
   bonding the subset of the plurality of chips to a target substrate.

2. The method of claim 1, wherein the first adhesive layer is formed from an ultraviolet-sensitive adhesive material and wherein selectively weakening regions of the first adhesive layer comprises exposing the regions to ultraviolet light.

3. The method of claim 2, wherein an adhesive strength of the first adhesive layer is greater than an adhesive strength of the second adhesive layer and wherein an adhesive of strength of the weakened regions is lower than an adhesive strength of the second adhesive layer.

4. The method of claim 2, wherein the first support wafer comprises a glass material that is transparent to ultraviolet light and wherein selectively weakening regions of the first adhesive layer comprises providing ultraviolet light through the first support wafer to reach the first adhesive layer.

5. The method of claim 1, further comprising debonding the subset of the plurality of chips from the second support wafer.

6. The method of claim 5, wherein debonding the subset of the plurality of chips from the second support wafer comprises applying heat to the second adhesive layer to decrease an adhesive strength of the second adhesive layer.

7. A method of bonding chips to a substrate, comprising:
   bonding a plurality of chips to a first support wafer by a first adhesive layer;
   bonding the plurality of chips to an intermediate support wafer by a second adhesive layer;
   selectively weakening regions of the first adhesive layer to decrease an adhesive strength in weakened regions;
   selectively weakening regions of the second adhesive layer to decrease an adhesive strength in weakened regions;
   separating the intermediate support wafer from the first wafer, such that a subset of the plurality of chips in the weakened regions of the first adhesive layer debond from the first support wafer, leaving a remainder of the plurality of chips bonded to the first support wafer;
   bonding the remainder of the plurality of chips to a final support wafer by a third adhesive layer;
   weakening remaining regions of the first adhesive layer to decrease an adhesive strength;
   debonding the remainder of the plurality of chips from the first support wafer; and
   bonding the remainder of the plurality of chips to a target substrate.

8. The method of claim 7, wherein the first adhesive layer and the second adhesive layer are formed from an ultraviolet-sensitive adhesive material and wherein selectively weakening regions of the first adhesive layer, selectively weakening regions of the second adhesive layer, and weakening remaining regions in the first adhesive layer each comprises exposing the regions to ultraviolet light.

9. The method of claim 8, wherein an adhesive of strength of the weakened regions of the first adhesive layer is lower than an adhesive strength of the third adhesive layer.

10. The method of claim 8, wherein the first and intermediate support wafers comprise a glass material that is transparent to ultraviolet light and wherein selectively weakening regions of the first adhesive layer, selectively weakening regions of the second adhesive region, and weakening remaining regions of the first adhesive region each comprises providing ultraviolet light through the respective support wafer to reach the respective adhesive layer.

11. The method of claim 7, further comprising debonding the subset of the plurality of chips from the final support wafer.

12. The method of claim 11, wherein debonding the subset of the plurality of chips from the final support wafer comprises applying heat to the third adhesive layer to decrease an adhesive strength of the third adhesive layer.

13. A transfer wafer, comprising:
a glass wafer substrate comprising one or more masks patterned on a surface of the glass wafer that leave at least one region exposed;
an ultraviolet-sensitive adhesive layer directly on the glass wafer substrate, on a side of the glass wafer opposite to the one or more masks, comprising a plurality of adhesive islands separated from one another by gaps of less than 20nm; and
a plurality of chips bonded to the glass wafer substrate by respective islands of the ultraviolet-sensitive adhesive layer, wherein the plurality of chips are embedded in the respective islands of the ultraviolet-sensitive adhesive layer, with adhesive material between the plurality of chips and the glass wafer substrate and with further adhesive material formed around sidewalls of the plurality of chips, and wherein a subset of the plurality of chips in the at least one exposed region are bonded less strongly than a remainder of the plurality of the chips.

14. The transfer wafer of claim 13, wherein the adhesive layer is an ultraviolet-sensitive adhesive layer that has weakened adhesive strength after exposure to ultraviolet light.

15. The transfer wafer of claim 14, wherein the subset of the plurality of chips are located in regions of the ultraviolet-sensitive adhesive layer that has been exposed to ultraviolet light.

16. The transfer wafer of claim 14, wherein the glass substrate is transparent to ultraviolet light at frequencies that weaken the adhesive strength of the ultraviolet-sensitive adhesive layer.

17. The transfer wafer of claim 13, wherein the locations of subset of the plurality of chips correspond to target locations on a target package wafer.

18. The transfer wafer of claim 13, wherein the plurality of chips each comprise a chip body and a source wafer remnant, the source wafer remnant having a larger area than an area of the chip body.

19. The transfer wafer of claim 18, wherein the plurality of chips are each oriented such that the chip body is closer to the glass substrate wafer than the source wafer remnant.

* * * * *